United States Patent
Rusu et al.

(10) Patent No.: US 7,038,515 B2
(45) Date of Patent: May 2, 2006

(54) SOFT-ERROR RATE HARDENED PULSED LATCH

(75) Inventors: Stefan Rusu, Sunnyvale, CA (US);
Peter Hazucha, Beaverton, OR (US);
Tanay Karnik, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/741,560

(22) Filed: Dec. 19, 2003

(65) Prior Publication Data

US 2005/0134347 A1  Jun. 23, 2005

(51) Int. Cl.
*H03K 3/356* (2006.01)
(52) U.S. Cl. .................... 327/208; 327/218
(58) Field of Classification Search ............ 327/199, 327/200, 201, 202, 203, 208–213, 218
See application file for complete search history.

(56) References Cited

U.S. PATENT DOCUMENTS

| | | | | |
|---|---|---|---|---|
| 5,111,429 | A | * | 5/1992 | Whitaker .................. 365/156 |
| 5,311,070 | A | * | 5/1994 | Dooley ..................... 327/208 |
| 5,949,266 | A | * | 9/1999 | Hinds et al. .............. 327/208 |
| 6,121,807 | A | * | 9/2000 | Klass et al. .............. 327/218 |
| 6,566,927 | B1 | * | 5/2003 | Park et al. ................ 327/211 |
| 2004/0095175 | A1 | * | 5/2004 | Chalasani ................. 327/202 |

FOREIGN PATENT DOCUMENTS

JP   5-37305   *   2/1993

OTHER PUBLICATIONS

Calin, T., "Upset Hardened Memory Design for Submicron CMOS Technology", *IEEE Transactions on Nuclear Science*, 43, (Dec. 1996),2874-2877.

Hazucha, Peter, "Measurements and anlysis of SER tolerant latch in a 90nm dual-Vt CMOS process", *Proceedings of the Custom Integrated Circuits Conference*, (2003),617-620.

* cited by examiner

*Primary Examiner*—Tuan T. Lam
(74) *Attorney, Agent, or Firm*—Schwegman, Lundberg, Woessner & Kluth, P.A.

(57) ABSTRACT

A latch includes a memory unit, a transfer unit, an inversion unit, and an output unit. The Memory unit includes a number of storage nodes. The transfer unit transfers a data from a data input node to the storage nodes via a plurality of data paths. Each of the data paths includes a pass element controlled by a pulse. The inversion unit inverts the data before the data is transferred from the data input node to at least one of the storage nodes. The output unit outputs the data from the memory unit to a latch output node. The memory unit, the transfer unit, the inversion unit, and the output unit of the latch form a soft-error rate hardened latch structure with a reduced number of elements and reduced power consumption.

14 Claims, 11 Drawing Sheets

SOFT-ERROR RATE HARDENED PULSED LATCH

FIELD

Embodiments of the present invention relate generally to integrated circuits, and more particularly to storage elements.

BACKGROUND

Integrated circuits such as microprocessors reside in many computers and electronic devices. Most integrated circuits have storage elements to store data.

A latch is one type of storage element. A typical latch stores a piece of data. At a specific time, one or more circuit elements get the piece of data from the latch for further processing.

Latches have many different structures. Some latches are less susceptible to soft-errors (loss of data) than other latches. Alpha particles emitted by packaging materials and cosmic rays from deep space may create the soft-errors in latches. A latch with a reduced soft-error rate may occupy larger circuit area and higher power consumption than a latch without a soft-error protection.

Therefore, to preserve the goal of smaller and low power integrated circuits, designing a latch with a reduced soft-error rate becomes difficult.

DESCRIPTION OF EMBODIMENTS

Figure 1:
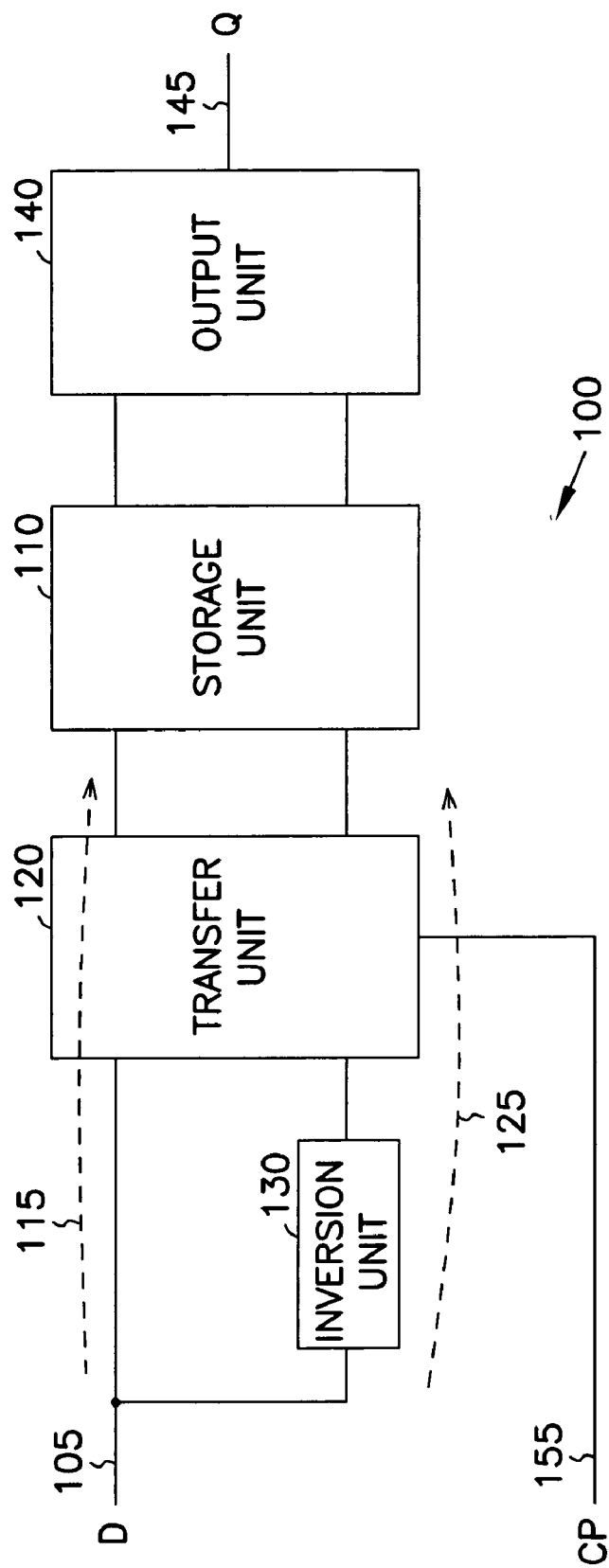
FIG. 1 shows a block diagram of a latch.

The following description and the drawings illustrate specific embodiments of the invention sufficiently to enable those skilled in the art to practice the invention. Other embodiments may incorporate structural, logical, electrical, process, and other changes. In the drawings, like numerals describe substantially similar components throughout the several views. Examples merely typify possible variations. Portions and features of some embodiments may be included in or substituted for those of others. The scope of the invention encompasses the full ambit of the claims and all available equivalents.

FIG. 1 shows a block diagram of a latch. Latch 100 includes a memory unit 110 to store data. A data signal D at a data input node 105 represents the data to be stored in memory unit 110. A transfer unit 120 transfers or passes the data from data input node 105 to memory unit 110 via a plurality of data paths 115 and 125. An inversion unit 130 is located on data path 125, which connects between data input node 105 and transfer unit 120. An inversion unit 130 inverts the data on data path 125 before the data from data input node 105 is transferred to memory unit 110 via data path 125.

Memory unit 110 stores different versions of the data represented by the D signal at data input node 105. The different versions of the data include a true version of the D signal and an inverted version (or complimentary version) of the D signal. Transfer unit 120 transfers the true version of the D signal to memory unit 110 via data path 115. Transfer unit 120 transfers the inverted version of the D signal to memory unit via data path 125. In this specification, data and data signal represent the same element and are used interchangeably.

Latch 100 also includes an output unit 140 to output an output signal Q at a latch output node 145. Latch 100 receives a signal CP at an enable node 155 to enable transfer unit 120 to control the transfer of data on data paths 115 and 125. In some embodiments, the CP signal includes a plurality of pulses. The CP signal has high signal level and a low signal level. The CP signal has a pulse during the high signal level. In some embodiments, the high signal level and the low signal have unequal time intervals. For example, in the CP signal, the high signal level has a smaller time interval than the low signal level.

Transfer unit 120 uses the pulses of the CP signal to selectively transfer data from data input node 105 to memory unit 110 via data paths 115 and 125. In some embodiments, transfer unit 120 transfers data from data input node 105 to memory unit 110 when the CP signal has a pulse (e.g., during the high signal level of the CP signal). When the CP signal has no pulse (e.g., during low signal level of the CP signal), no data is transferred from data input node 105 to memory unit 110. By using the pulses of the CP signal to transfer the data, transfer unit 120 selectively transfers the data from data input node 105 to memory unit 110. Output unit 140 outputs or transfers the data from memory unit 110 to latch output node 145 as the Q signal.

Figure 2:
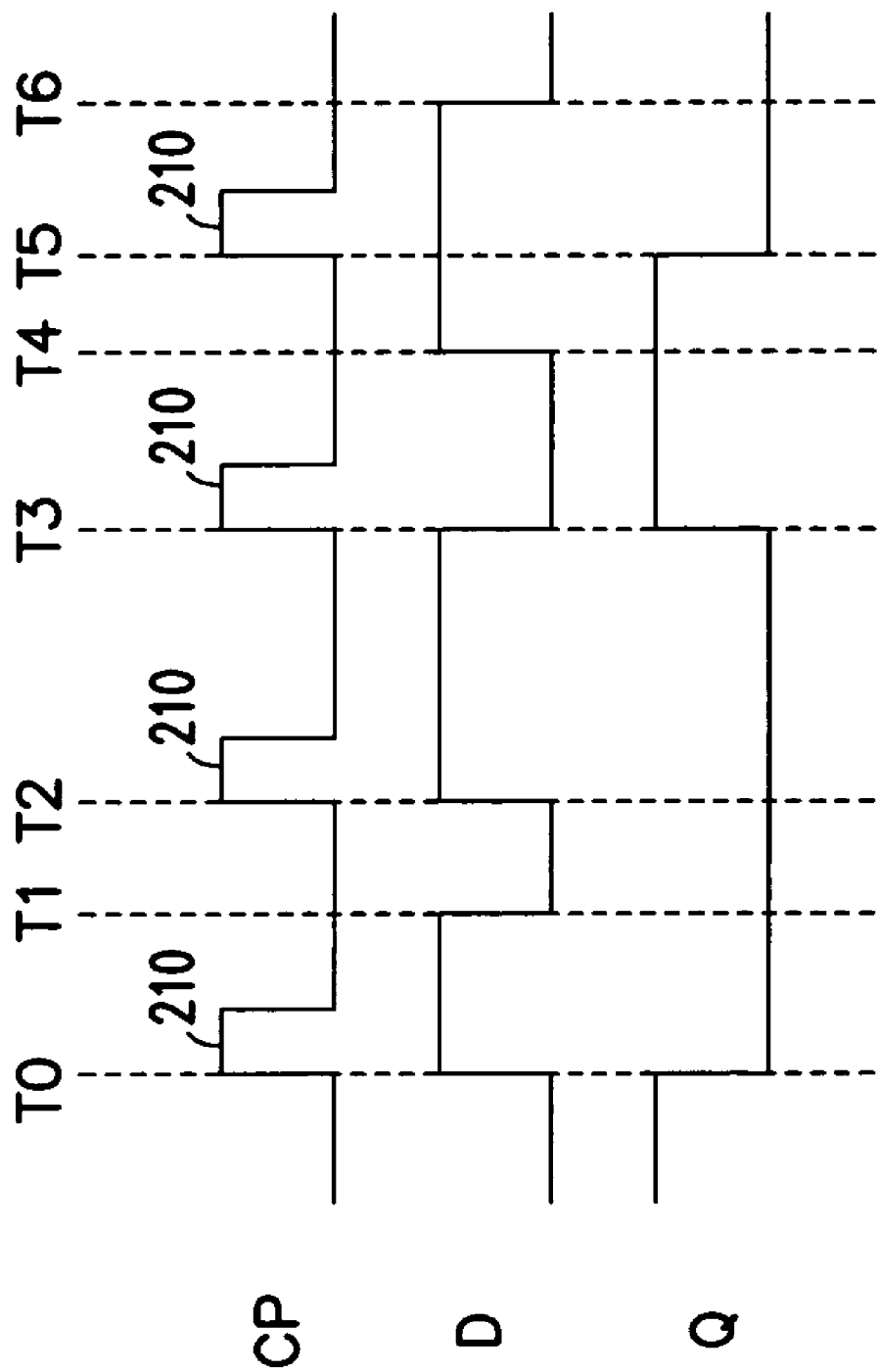
FIG. 2 is a timing diagram for the latch of FIG. 1.

FIG. 2 is a timing diagram for latch 100 of FIG. 1. In FIG. 2, the CP signal includes a number of pulses 210 which appear during the high signal levels of the CP signal. The D signal has exemplary signal levels between times T0–T6. The CP signal has a pulse appearing at times T0, T2, T3, and T5. Between two specific times (e.g., between times T0–T1), the Q signal is an inverted version of the D signal when a pulse appears between that two specific times. The Q signal remains at the same state when no pulse appears during any two times (e.g., between times T1–T2) regardless of the states of the D signal. For example, during times T0-T1, T2–T3, T3–T4, and T5–T6, a pulse appears and the Q signal is an inverted version of the D signal. During times T1–T2 and T4–T5, no pulse appears and the Q signal remains at the same state although the D signal changes states at times T1 and T4.

Figure 3:
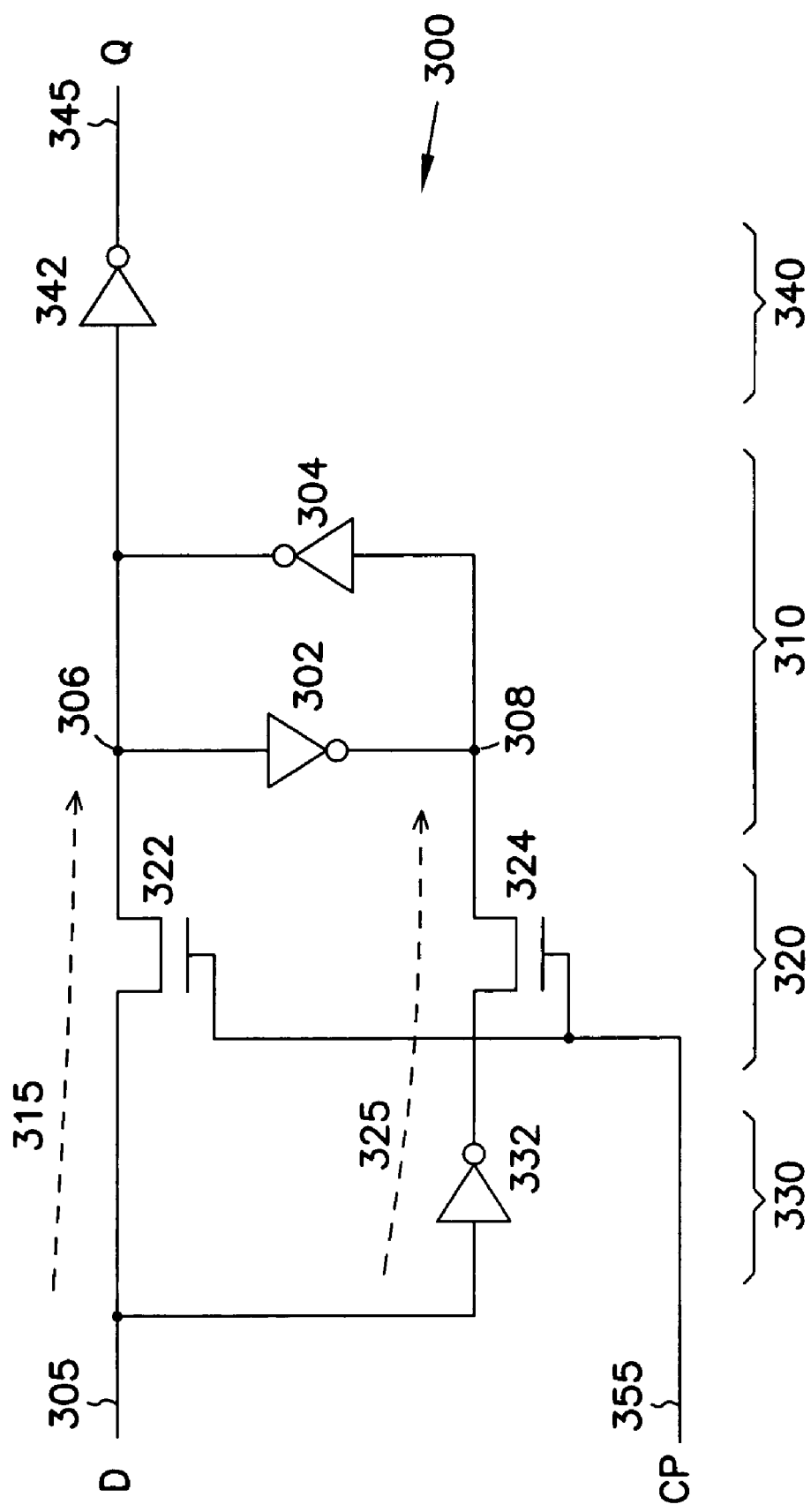
FIG. 3 shows a schematic diagram of a latch.

FIG. 3 shows a schematic diagram of a latch. Latch 300 includes a memory unit 310, a transfer unit 320, an inversion unit 330, and an output unit 340.

Memory unit 310 includes inverters 302 and 304 connected back to back at storage nodes 306 and 308. A data signal D at a data input node 305 represents the data to be stored at storage nodes 306 and 308.

Transfer unit 320 includes pass elements 322 and 324. In embodiments represented by FIG. 3, each of pass elements 322 and 324 is a single transistor. Pass element 322 is located on a first data path 315, which connects between data input node 305 and storage node 306. Pass element 322 transfers data on data path 315 to storage node 306. Pass element 324 is located on a second data path 325, which connects between data input node 305 and storage node 308. Pass element 324 transfers data on path 325 to storage node 308.

Inversion unit 330 includes an inverter 332 located on data path 325. Inverter 332 connects between data input node 305 and pass element 324 to invert the data from data input node 305 before the data is transferred to storage node 308.

Memory unit 310 stores different versions of the data represented by the D signal at data input node 305. The different versions of the data include a true version of the D signal and an inverted version of the D signal. Pass element 322 transfers the true version of the D signal from data input node 305 to storage node 306 via data path 315. Pass element 324 transfers the inverted version of the D signal from data input node 305 to storage node 308 via data path 325.

Each of the pass elements 322 and 324 has an active state (on) and an inactive state (off). Latch 300 receives a CP signal on a control node 355 to control pass elements 322 and 324. In some embodiments, the CP signal includes a plurality of pulses. The CP signal has high signal level and a low signal level. The CP signal has a pulse during the high signal level. In some embodiments, the high signal level has a smaller signal time interval than the low signal level.

Latch 300 uses the pulses of the CP signal to switch pass elements 322 and 324 between the active and the inactive states to selectively transfer the data from data input node 305 to storage nodes 306 and 308. Pass elements 322 and 324 are in the active state when the CP signal has a pulse. In the active state, pass elements 322 and 324 pass (transfer) the data from data input node 305 to storage nodes 306 and 308 via data paths 315 and 325, respectively. Pass elements 322 and 324 are in the inactive state when the CP signal has a no pulse. In the inactive state, pass element 322 and 324 prevents the passage of data from data input node 305 to storage nodes 306 and 308.

Output unit 340 includes an inverter 342 to transfer the data from storage node 306 to a latch output node 345. An output signal Q represents the data at latch output node 345.

Figure 4:
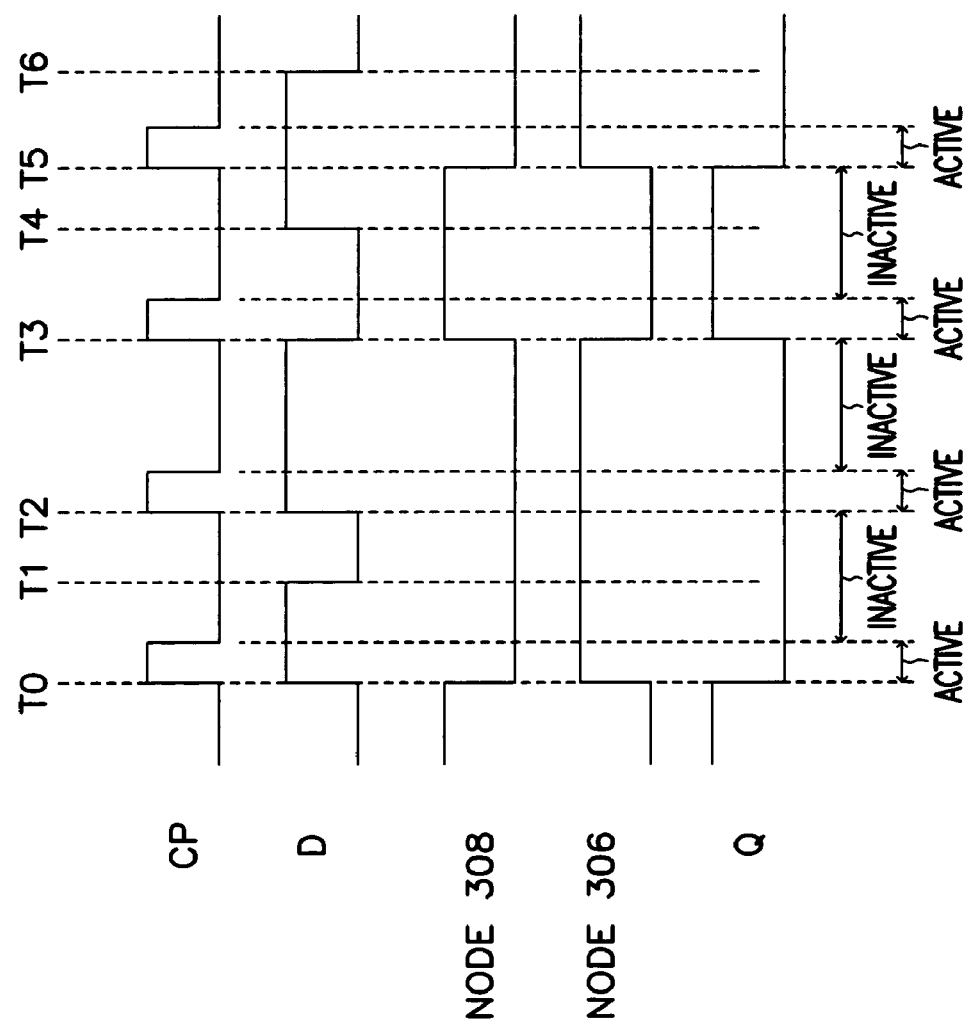
FIG. 4 is a timing diagram for the latch of FIG. 3.

FIG. 4 is a timing diagram for latch 300 of FIG. 3. In FIG. 4, the times T0–T6, the CP signal, and D signal are similar to that of the timing diagram of FIG. 2. In FIG. 4, the "ACTIVE" and "INACTIVE" indicators represent the active and inactive states of pass elements 322 and 324 of FIG. 3. FIG. 4 shows that the active state occurs when the CP signal has a pulse (high signal level); the inactive state occurs when the CP signal has no pulse (low signal level). During a specific time, the signal at storage node 308 is an inverted version of the D signal when a pulse appears during that specific time. The signal at storage node 308 remains at the same state when no pulse appears regardless of the states of the D signal. For example, during times T0–T1, T2–T3, T3–T4, and T5–T6, the signal at storage node 308 is an inverted version of the D signal because a pulse appears at time T0, T2, T3, and T5. During times T1–T2 and T4–T5, the signal at storage node 308 remains at the same state because no pulse appears during times T1–T2 or T4–T5 although the D signal changes states at times T1 and T4. The signal at storage node 306 is an inverted version of the signal at storage node 308. The output Q signal is an inverted version of the signal at storage node 306.

Figure 5:
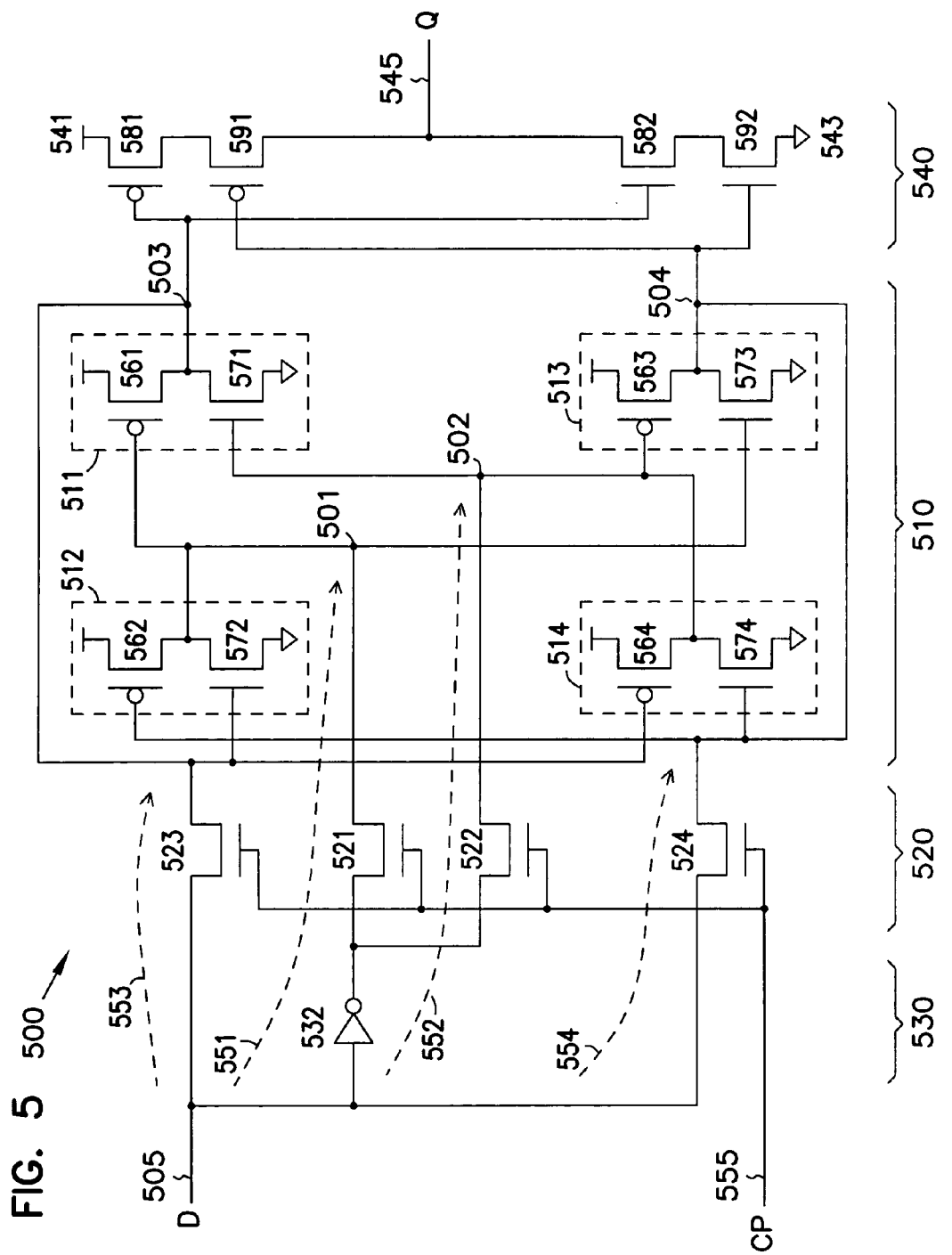
FIG. 5 shows a latch with a soft-error rate hardened structure.

FIG. 5 shows a latch with soft-error rate hardened structure. Latch 500 includes a memory unit 510, a transfer unit 520, an inversion unit 530, and an output unit 540. Memory unit 510 includes a plurality of storage nodes 501, 502, 503, and 504 (501–504) to store data. The signal D at a data input node 505 represents the data to be stored at storage nodes 501–504. Transfer unit 520 transfers different versions of the D signal to storage nodes 501–504 via a plurality of data paths 551, 552, 553, and 554 (551–554). Inversion unit 530 inverts the data at data input node 505 before the data at data input node 505 is transferred to storage nodes 501 and 502. Output unit 540 outputs an output signal Q at a latch output node 545.

Memory unit 510, transfer unit 520, inversion unit 530, and output unit 540 form a soft-error rate hardened structure latch to automatically correct any invalid error caused by soft-error events. By automatically correcting invalid data within latch 500, circuit elements connected to latch output node 545 of latch 500 are protected from receiving invalid data when soft-error events occur at latch 500.

Latch 500 performs a logic function similar to that of a conventional master-slave flip flop. However, in some cases, however, latch 500 has a circuit area (e.g., an area on a circuit die) and power consumption equal to that of the un-hardened conventional master-slave flip flop. When an un-hardened conventional master-slave flip flops is hardened to reduce the soft-error rate, the circuit area and power consumption of the hardened conventional master-slave flip flop are usually greater than that of the un-hardened conventional master-slave flip flop. Since latch 500 has a circuit area and power consumption equal to that of the un-hardened conventional master-slave flip flop, latch 500 also has a smaller circuit area and lower power consumption than the hardened conventional master-slave flip flop.

In some cases, the circuit area and the power consumption of the hardened conventional master-slave flip flop are twice as that of the un-hardened conventional master-slave flip flop. Since latch 500 has a circuit area and power consumption equal to the un-hardened conventional master-slave flip flop, latch 500 has a circuit area and power consumption that are one-half of that of the hardened conventional master-slave flip flop.

Memory unit 510 includes inverters 511, 512, 513, and 514 (511–514). Each of the inverters 511–514 has input nodes connected to two of the storage nodes 501–504 and an output node connected to one of the storage nodes 501–504. For example, inverter 511 has input nodes connected to storage nodes 501 and 502 and an output node connected to storage node 503. Each of the inverters 511–514 has a pair of transistors having gates and a common drain. Within an inverter, gates of the transistors are the input nodes of the inverter and the common drain is the output node of the inverter. For example, inverter 511 has transistors 561 and 571 in which the input nodes of inverter 511 are the gates of transistors 561 and 571 and the output node of inverter 511 is the common drain of transistors 561 and 571. The gates of transistors 561 and 571 (input nodes of inverter 511) connect to storage nodes 501 and 502, respectively. The common drain of transistors 561 and 571 (the output node of inverter 511) connects to storage node 503. Each of the other inverters 512, 513, and 514 also has a pair of transistors (562 and 572, 563 and 573, or 564 and 574) with input nodes and an output node connected to the storage nodes 501–504 in a similar manner as that of inverter 511.

Transfer unit 520 includes pass elements 521, 522, 523, and 524 (521–524). In embodiments represented by FIG. 5, each of pass elements 521–524 is a single transistor. Each of the pass elements 521–524 is located on one of the data paths 551–554 in which each of the data paths connects between data input node 505 and one of the storage nodes 501–504. For example, pass element 523 is located on data path 553, which connects between data input node 505 and storage node 503. Pass element 523 transfers data from data input node 505 to storage node 503 via data path 553. Pass elements 521, 522, and 524 are located on data paths 551, 552, and 554, respectively. Data paths 551, 552, and 554 connect between data input node 505 and storage nodes 501, 502, and 504, respectively.

Inversion unit 530 includes an inverter 532 located on data path 551 and on data path 552. Inverter 532 connects between data input node 505 and each of the pass elements 521 and 522 to invert the data from data input node 505 before the data from data input node 505 is transferred to storage nodes 501 and 502.

Memory unit 510 stores different versions of the data represented by the D signal at data input node 505. The different versions of the data include a true version of the D signal and an inverted version of the D signal. Pass elements 523 and 524 transfer the true version of the D signal to storage nodes 503 and 504 via data paths 553 and 554, respectively. Pass elements 521 and 522 transfer the inverted version of the D signal from data input node 505 to storage nodes 501 and 502 via data paths 551 and 552, respectively.

Each of the pass elements 521–524 has an active state and an inactive state. Latch 500 receives a CP signal at an enable node 555 to control pass elements 521–524. In some embodiments, the CP signal includes a plurality of pulses. The CP signal has high signal level and a low signal level. The CP signal has a pulse during the high signal level. In some embodiments, the high signal level has a smaller signal time interval than the low signal level.

Latch 500 uses the pulses of the CP signal to switch pass elements 521–524 between the active state and the inactive state to selectively transfer the data from data input node 505 to storage nodes 501–504. Pass elements 521–524 are in the active state when the CP signal has a pulse. In the active state, pass elements 521–524 pass the data from data input node 505 to storage nodes 501–504 via data paths 551–554, respectively. Pass elements 521–524 are in the inactive state when the CP signal has no pulse. In the inactive state, pass element 521–524 prevents the passage of data from data input node 505 to storage nodes 501–504.

Output unit 340 includes a first pair of transistors formed by transistors 581 and 591 and a second pair of transistors formed by transistors 582 and 592. The transistors within each pair of transistors have the same transistor type. For example, transistors 581 and 591 are p-channel transistors and transistors 582 and 592 are n-channel transistors. Transistors 581 and 591 connect in series between a supply node 541 and latch output node 545. The gates of transistors 581 and 591 connect to storage nodes 503 and 504. The drain of transistor 591 connects to latch output node 545. Transistors 582 and 592 connect in series between a supply node 543 and latch output node 545. The gates of transistors 582 and 592 connect to storage nodes 503 and 504. The drain of transistor 582 connects to latch output node 545.

Output unit 540 outputs the Q signal based on the value of the data at storage node 503 and 504. When storage nodes 503 and 504 have the same value (e.g., high), either both of the transistors 581 and 591 or both of the transistors 582 and 592 are active and output a data represented by the Q signal at latch output node 545. When nodes 503 and 504 have unequal values (e.g., one high and one low) due to an event such as a soft-error event, one of the transistors 581 and 591 is inactive (off) and one of the transistors 582 and 592 is also inactive. In this case, the data at storage node 503 or node 504 is invalid. However, the invalid data at node 503 or node 504 does not cause output unit 540 to change the Q signal at latch output node 545. When one of the transistors 581 and 591 is inactive and one of the transistors 582 and 592 is inactive due to an invalid data at storage nodes 503 and 504, the path from supply node 541 to latch output node 545 via transistors 581 and 591 is cut off. The path from supply node 543 to latch output node 543 is also cut off. When the paths from supply nodes 541 and 543 to latch output node 545 are cut off, output unit 540 does not drive the Q signal on latch output node 545. Thus, when the data at storage node 503 or node 504 is invalid due to an event such as the soft-error event, the Q signal does not reflect the changes in storage nodes 503 and 504. The acts of inverters 511–514 of latch 500 automatically restore the correct values (original values) at storage nodes 503 and 504. After the correct values are restored, output unit 540 resumes driving the data at latch output node 545 based one the correct values at storage nodes 503 and 504. The acts of inverters 511–514 of latch 500 also automatically restore the correct values at other storage nodes 501 and 502 when a soft-error event occurs.

Figure 6:
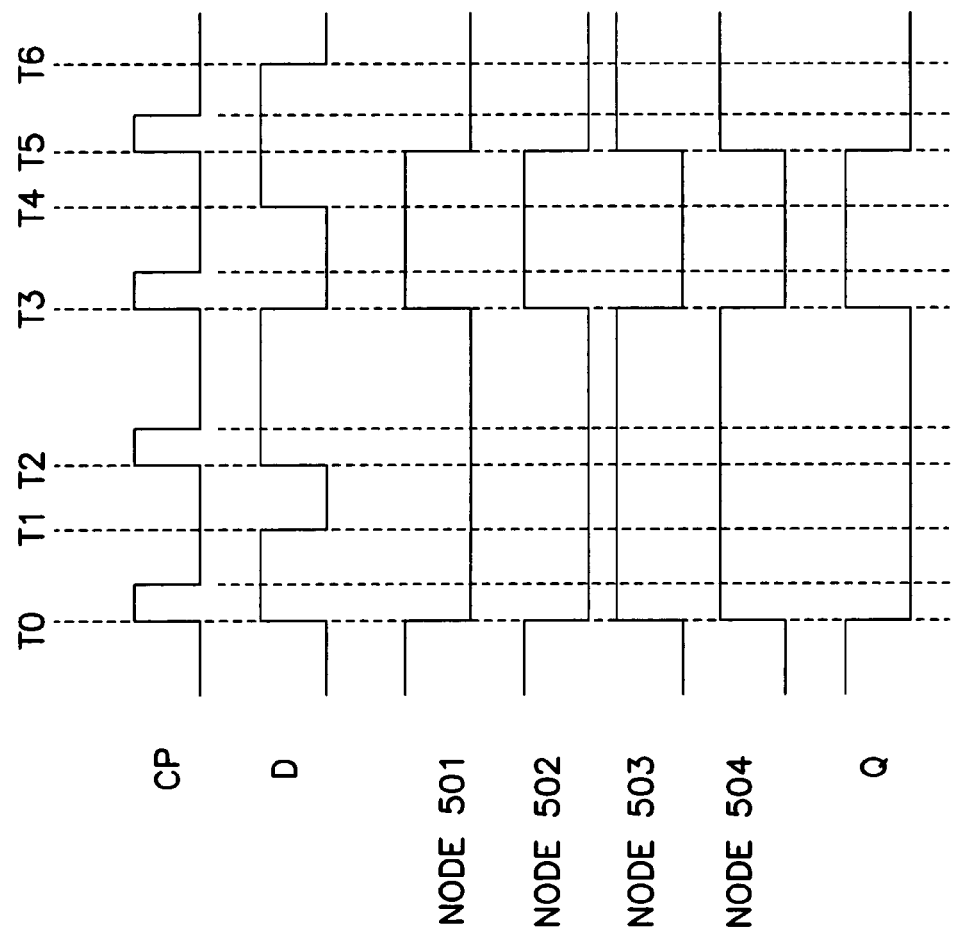
FIG. 6 is a timing diagram for the latch of FIG. 5.

FIG. 6 is a timing diagram for latch 500 of FIG. 5. In FIG. 6, the times T0–T6, the CP signal, and D signal are similar to that of the timing diagram of FIG. 2 and FIG. 4. The signal at storage nodes 501 and 502 are the inverted versions of the D signal when a pulse appears. During a specific time, the signal at storage nodes 503 and 504 are the true versions of the D signal when a pulse appears during that specific time. The signal at all storage nodes 501–504 remain at the same state when no pulse appears during a specific time regardless the states of the D signal during that specific time. For example, during times T0–T1, T2–T3, T3–T4, and T5–T6, the signals at storage nodes 501 and 502 are an inverted version of the D signal because a pulse appears at time T0, T2, T3, and T5. During times T1–T2 and T4–T5, the signal at all storage nodes 501–504 remain at the same state because no pulse appears between times T1–T2 or T4–T5 although the D signal changes states at times T1 and T4. The output Q signal is an inverted version of the signals storage nodes 503 and 504.

Figure 7:
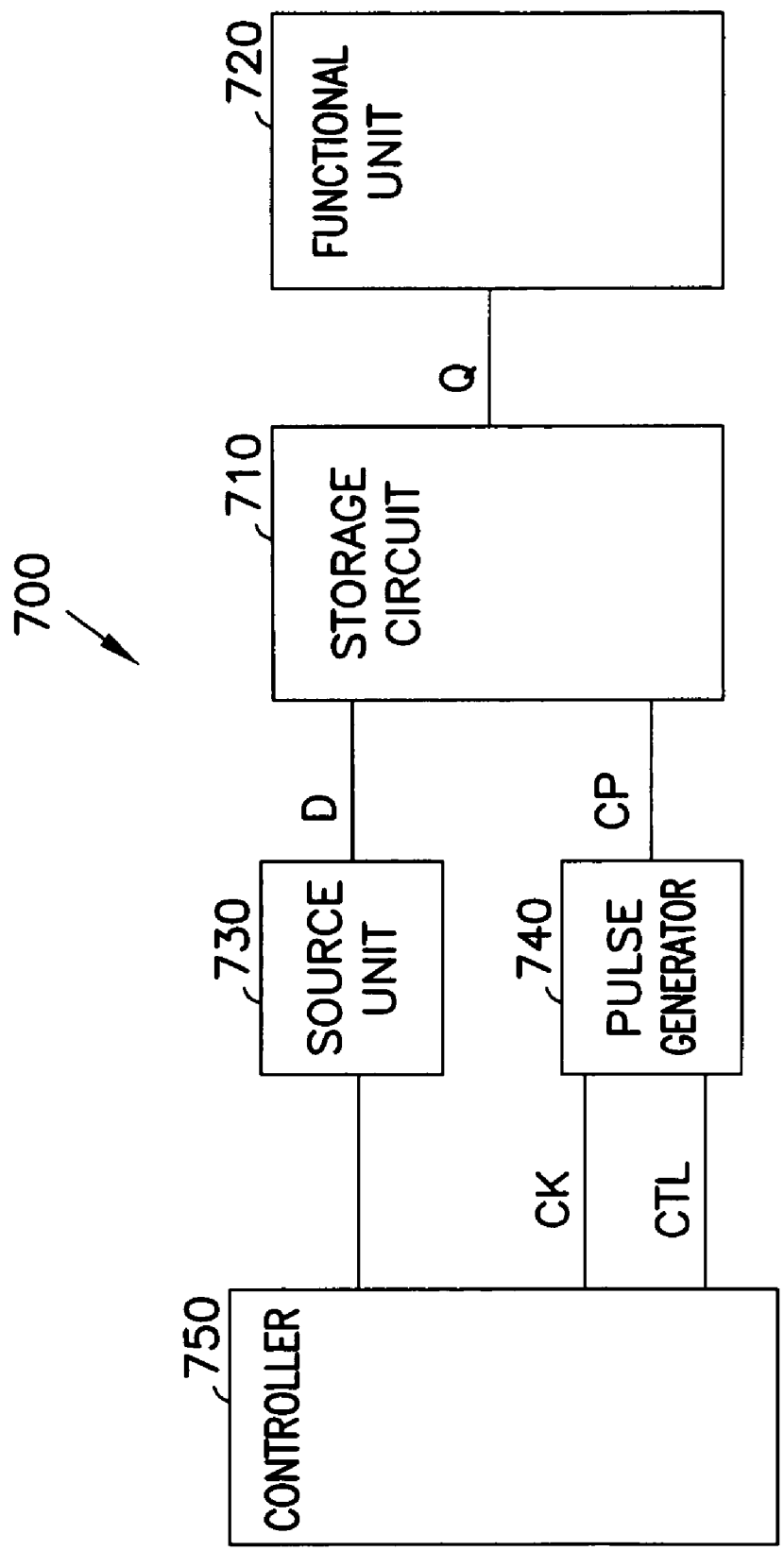
FIG. 7 shows an integrated circuit.

FIG. 7 shows an integrated circuit. Integrated circuit 700 includes a storage circuit 710 to receive and store a data represented by the D signal. Storage circuit 710 also passes a signal Q to a functional unit 720. The Q signal is a version of the D signal. In some embodiments, the Q signal is an inverted version of the D signal. Storage circuit 710 includes embodiments of latch 100 (FIG. 1), latch 300 (FIG. 3), and latch 500 (FIG. 5). In FIG. 7, the data D is provided by a source unit 730. Integrated circuit 700 also includes a pulse generator 740 to generate a signal CP. In some embodiments, the CP signal includes a plurality of pulses. Storage circuit 710 receives the CP signal to control the passage of the D signal from source unit 730 to functional unit 720. Integrated circuit 700 further includes a controller 750 to provide a clock signal CLK and a control signal CTL to pulse generator 740.

In some embodiments, the CLK signal is a periodic signal. In other embodiments, the CLK signal has a fifty percent duty cycle. In some embodiments, the pulse of the CP signal has a time interval smaller the time interval represented by the duty cycle of the CLK signal. For example, the pulse of the CP signal has a time interval smaller than the time interval of the high signal level of the CLK signal. In some embodiments, to save power, controller 750 uses the CTL signal to deactivate or suppress the pulse of the CP signal when no data is to be transferred from source unit 730 to functional unit 720. In some embodiments, integrated circuit 700 is a processor.

Figure 8:
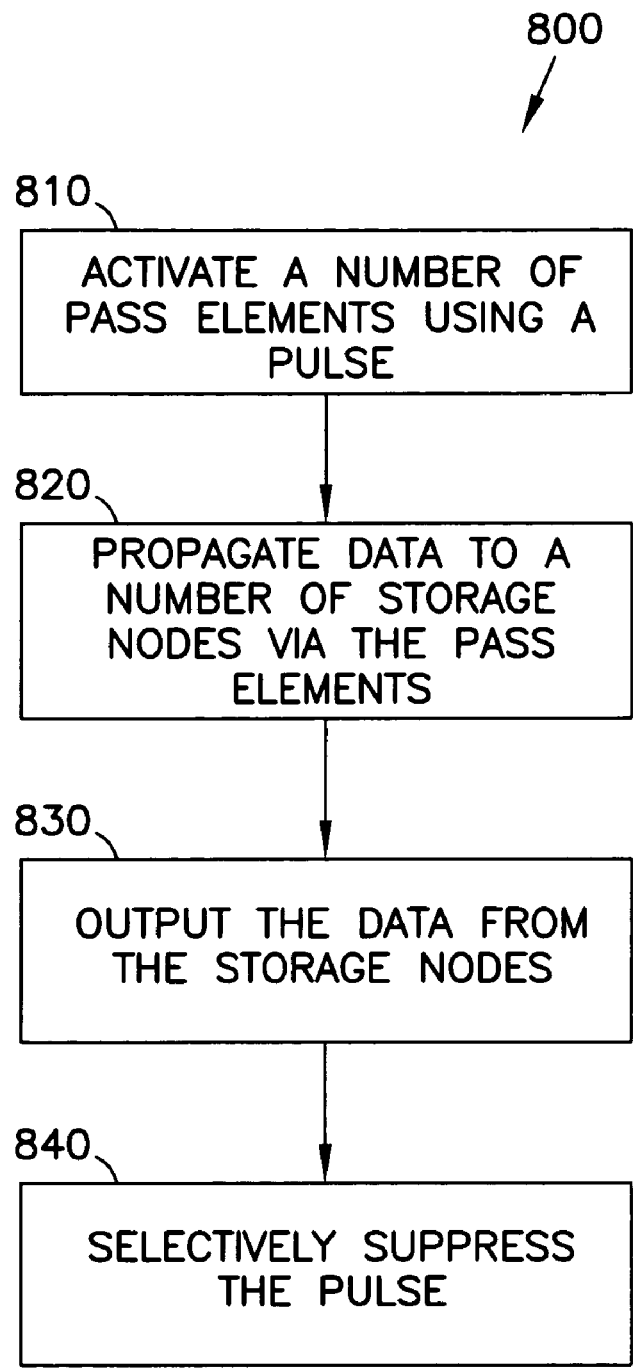
FIG. 8 is a flowchart of a method of processing data.

FIG. 8 is a flowchart of a method of processing data. Method 800 transfers data between units within a circuit, between units within an integrated circuit, or between units within a system. Method 800 may be performed by any one of the latch 100 (FIG. 1), latch 300 (FIG. 3), latch 500 (FIG. 5), and storage circuit 710 (FIG. 7).

Box 810 activates a number of pass gates on a number of data paths connected between a data input node and a number of storage nodes of a latch.

Box 820 propagates or transfers a data from the data input node to the storage nodes. The data is transferred to the storage nodes via the pass elements. The pass elements are switched between an active state to pass the data and an inactive state to prevent the passage of the data. In some embodiments, the pass element includes a single transistor in which the gate of the single transistor is controlled by a pulse instead of a clock signal having a fifty percent duty cycle. In some embodiments, controlling the pass element with a pulse saves power. Box 810 further inverts the data at the data input node to obtain an inverted version of the data before transferring the inverted version of the data to at least one of the storage nodes.

Box 830 outputs the data from the storage nodes to an output node. In some embodiments, the data at the output node is an inverted version of the data at the data input node.

Box 840 selectively suppresses the pulse to save power. For example, the pulse is suppressed to deactivate the pass elements when no data is to be transferred to the storage nodes of the latch.

Figure 9:
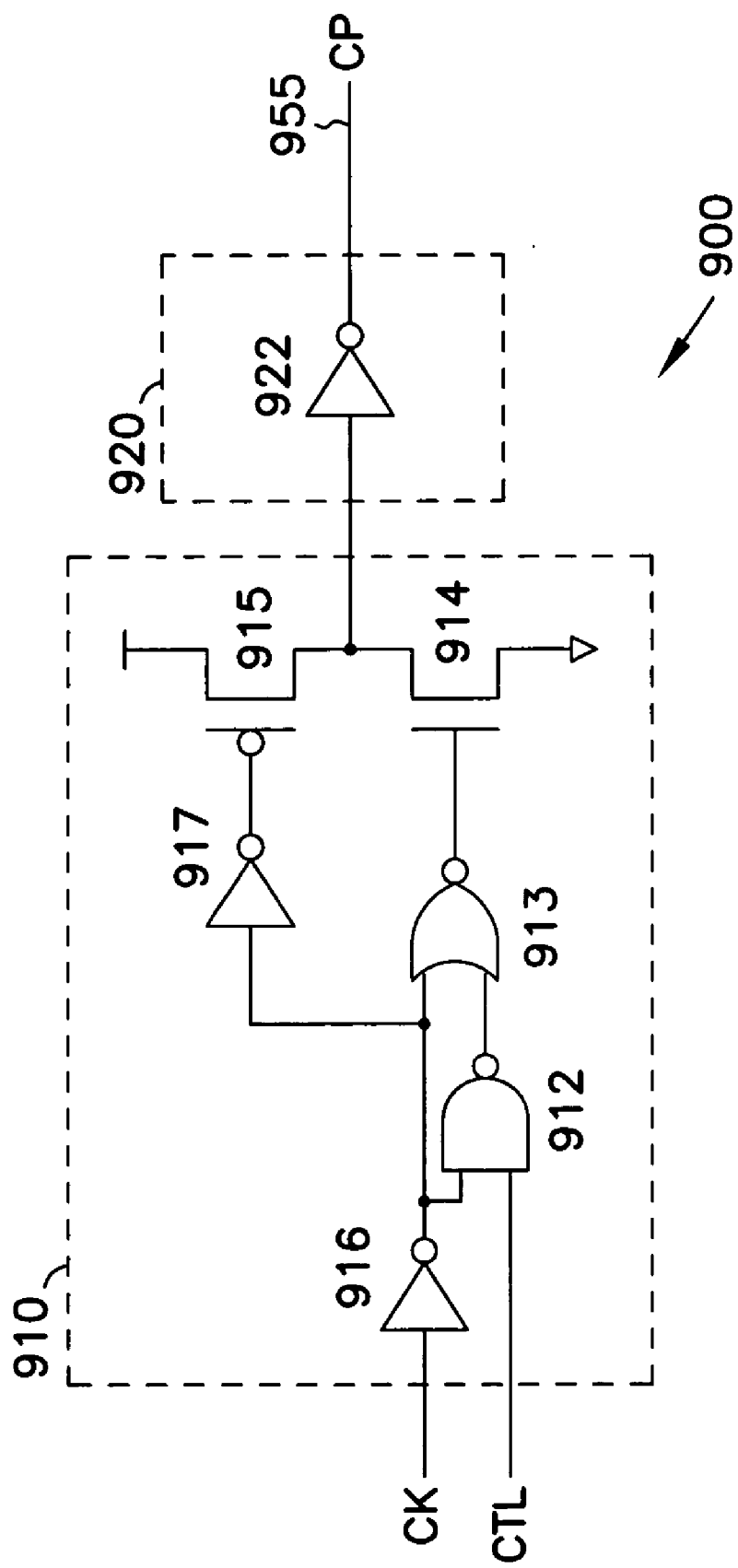
FIG. 9 shows a pulse generator.

FIG. 9 shows a pulse generator. Pulse generator 900 includes a generating unit 910 and a driver unit 920. Generating unit 910 generates a pulse based on a clock signal CK and a control signal CTL. Driver unit 920 includes an inverter 922 to drive the pulse as the CP signal at an output node 955. Generating unit 910 includes gates 912 and 913, transistors 914 and 915, and inverters 916 and 917. The operation of pulse generator is described in connection with FIG. 10.

Figure 10:
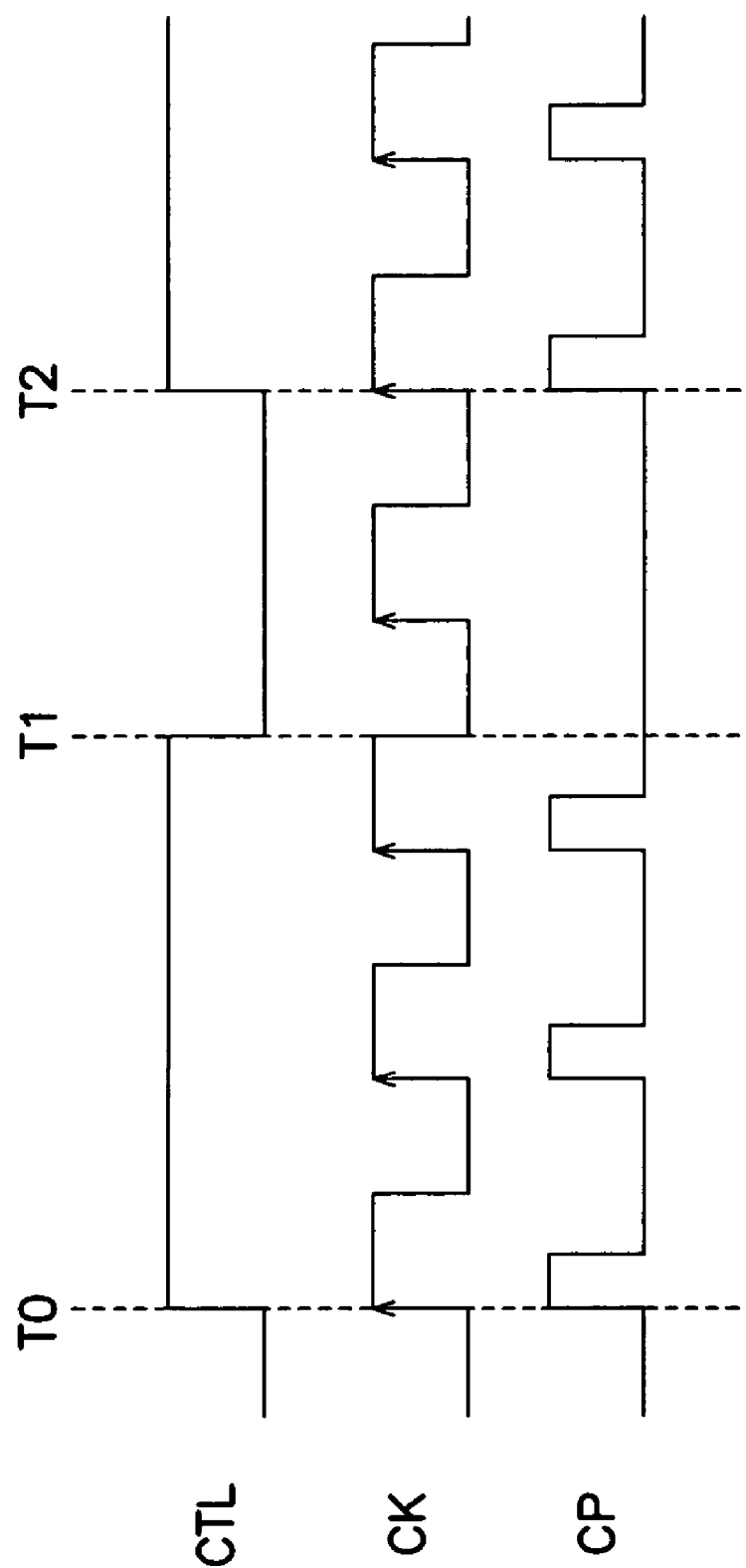
FIG. 10 is a timing diagram for the pulse generator of FIG. 9.

FIG. 10 is a timing diagram for the pulse generator 900 of FIG. 9. In FIG. 10, the CTL signal is activated to a high signal level between times T0–T1 and after time T2. The CTL signal is deactivated to a low signal level between times T1–T2. The clock signal CK periodically toggles. The CP signal has a pulse at each rising edge of the CK signal and while the CTL signal is high. The CP signal has no pulse (the pulse of the CP signal is suppressed) when the CTL signal is low regardless of the state of the CK signal.

In some embodiments, the CP signal generated by pulse generator 900 represents the CP signal provided to latch 100 (FIG. 1), latch 300 (FIG. 3), latch 500 (FIG. 5), and storage circuit 710 (FIG. 7). In these embodiments, the CTL signal is selectively deactivated to suppress the pulses of the CP signal. For example, when data is to be transferred to latches 100, 300, 500, or storage circuit 710, controller 750 activates the CLT signal to the high signal level to generate a pulse at the rising edge of the CK signal. When no data is to be transferred to latches 100, 300, 500, or storage circuit 710, controller 750 deactivates the CLT signal to the low signal level to suppress the pulses of the CP signal. Since the CP signal is generated based on the CTL signal, the CP signal is also selectively deactivated or selectively suppressed when the CLT signal is deactivated when no data is to be transferred to latches 100, 300, 500, or storage circuit 710.

Figure 11:
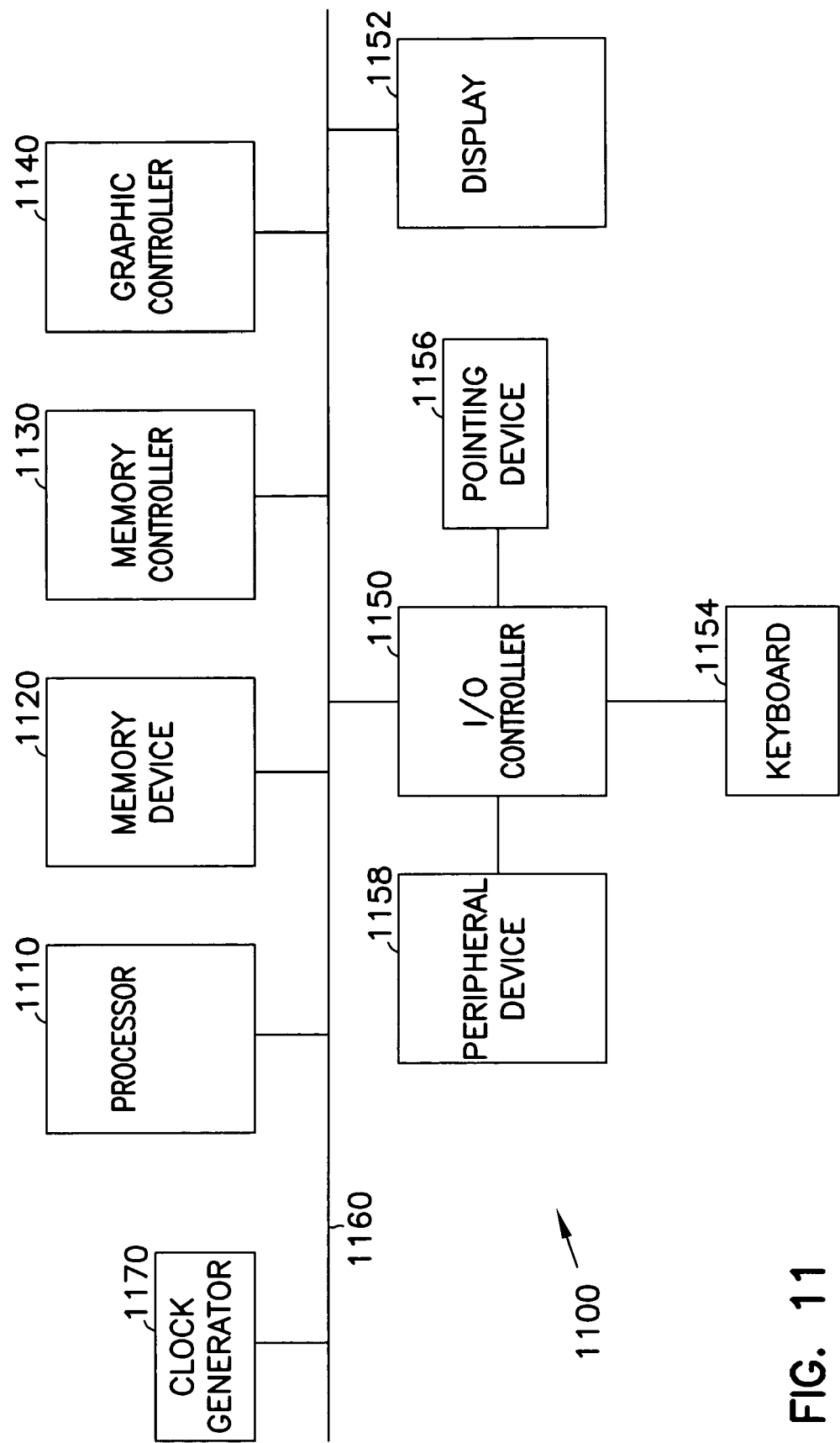
FIG. 11 shows a system.

FIG. 11 shows a system 1100. System 1100 includes a processor 1110, a memory device 1120, a memory controller 1130, a graphic controller 1140, an input and output (I/O) controller 1150, a display 1152, a keyboard 1154, a pointing device 1156, and a peripheral device 1158. A bus 1160 connects all of these devices together. A clock generator 1170 provides a signal CLK to at least one of the devices of system 1110 via bus 1160. Example of clock generator 1170 includes an oscillator in a circuit board such as a motherboard. Two or more devices shown in system 1100 may be formed in a single chip.

At least one of the devices shown in system 1100 includes an integrated circuit such as integrated circuit 700 including all elements shown in FIG. 1 through FIG. 10.

Bus 1160 may be interconnect traces on a circuit board or may be one or more cables. Bus 1160 may also connects the devices of system 1100 by wireless means such as by electromagnetic radiation, for example, radio waves. Peripheral device 1158 may be a printer, an optical device such as CD-ROM and DVD reader and writer, a magnetic device reader and writer such as a floppy disk driver, or an audio device such as a microphone.

Memory device 1120 may be a dynamic random access memory (DRAM) device. Examples of DRAM devices include synchronous DRAM commonly referred to as SDRAM, SDRAM II, SGRAM (Synchronous Graphics Random Access Memory), DDR SDRAM (Double Data Rate SDRAM), and GDDR SDRAM (Graphic Double Data Rate). Memory device 1120 may also be a static random access memory (SRAM) device, or may be a flash memory device.

System 1100 represented by FIG. 11 includes computers (e.g., desktops, laptops, hand-helds, servers, Web appliances, routers, etc.), wireless communication devices (e.g., cellular phones, cordless phones, pagers, personal digital assistants, etc.), computer-related peripherals (e.g., printers, scanners, monitors, etc.), entertainment devices (e.g., televisions, radios, stereos, tape and compact disc players, video cassette recorders, camcorders, digital cameras, MP3 (Motion PictureExperts Group, Audio Layer 3) players, video games, watches, etc.), and the like.

What is claimed is:

1. A circuit comprising:
  a memory unit including a plurality of storage nodes;
  a transfer unit including a plurality of pass elements, each of the pass elements being located in a path coupled between a data input node and one of the plurality of storage nodes;
  an inversion unit coupled between the data input node and at least one of the plurality of pass elements; and
  an output unit coupled between the memory unit and a latch output node, wherein the memory unit further includes:
    a first inverter having an input node coupled to a first storage node of the plurality of storage nodes and an output coupled to a second storage node of the plurality of storage nodes;
    a second inverter having an input node coupled to the second storage node and an output coupled to the first storage node;
    a third inverter having an input node coupled to a third storage node of the plurality of storage nodes and an output coupled to a fourth storage node of the plurality of storage nodes; and
    a fourth inverter having an input node coupled to the fourth storage node and an output node coupled to the third storage node, wherein the output unit includes a first pair of transistors having gates coupled to the second and fourth storage nodes and a drain of a transistor of the first pair of transistors coupled to the latch output node, and a second pair of transistors having gates coupled to the second and fourth storage nodes and a drain of a transistor of the second pair of transistors coupled to the latch output node.

2. The circuit of claim 1, wherein each of the plurality of pass elements includes a transistor.

3. The circuit of claim 2, wherein the inversion unit includes an inverter having an input coupled to the data input node and an output node coupled to at least one of the plurality of pass elements.

4. A circuit comprising:
a memory unit including a first storage node, a second storage node, a third storage node, and a fourth storage node, a first pair of transistors having a first gate coupled to the first storage node, a second gate coupled to the second storage node, and a common drain coupled to the third storage node, a second pair of transistors having a first gate coupled to the first storage node, a second gate coupled to the second storage node, and a common drain coupled to the fourth storage node, a third pair of transistors having a first gate coupled to the third storage node, a second gate coupled to the fourth storage node, and a common drain coupled to the first storage node, and a fourth pair of transistors having a first gate coupled to the third storage node, a second gate coupled to the fourth storage node, and a common drain coupled to the second storage node;
a transfer unit including a first pass element coupled between a data input node and the first storage node, a second pass element coupled between the data input node and the second storage node, a third pass element coupled between the data input node and the third storage node, and a fourth pass element coupled between the data input node and the fourth storage node;
an inverter coupled between the data input node and the first and second pass elements; and
an output unit including at least one pair of transistors coupled between the memory unit and a latch output node.

5. The circuit of claim 4, wherein each of the first, second, third, and fourth pass elements includes only a transistor.

6. The circuit of claim 5, wherein the at least one pair of transistors of the output unit includes a first gate coupled to the third storage node, a second gate coupled to the fourth storage node, and a drain coupled to the latch output node.

7. The circuit of claim 6, wherein the output unit further includes a second pair of transistors having a first gate coupled to the third storage node, a second gate coupled to the fourth storage node, and a drain coupled to the latch output node.

8. The circuit of claim 7, wherein the at least one pair of transistors of the output unit includes transistors of a first transistor type.

9. An integrated circuit comprising:
a source unit to provide data;
a storage circuit including at least one latch to receive the data based on a pulse; and
a functional unit coupled to the storage circuit to obtain the data from the latch, the latch including:
a memory unit including a plurality of storage nodes;
a transfer unit including a plurality of pass elements, each of the pass elements being located in a path coupled between a data input node and one of the plurality of storage nodes;
an inversion unit coupled between the data input node and at least one of the plurality of pass elements; and
an output unit coupled between the memory unit and a latch output node, wherein the memory unit includes:
a first pair of transistors having a first gate coupled to a first storage node of the plurality of storage nodes, a second gate coupled to a second storage node of the plurality of the storage nodes, and a common drain coupled to a third storage node of the plurality of storage nodes;
a second pair of transistors having a first gate coupled to the first storage node, a second gate coupled to the second storage node, and a common drain coupled to a fourth storage node of the plurality of the storage nodes;
a third pair of transistors having a first gate coupled to the third storage node, a second gate coupled to the fourth storage node, and a common drain coupled to the first storage node; and
a fourth pair of transistors having a first gate coupled to the third storage node, a second gate coupled to the fourth storage node, and a common drain coupled to the second storage node.

10. The integrated circuit of claim 9, wherein the output unit includes:
a first pair of transistors having a first gate coupled to the third storage node, a second gate coupled to the fourth storage node, and a drain coupled to the latch output node; and
a second pair of transistors having a first gate coupled to the third storage node, a second gate coupled to the fourth storage node, and a drain coupled to the latch output node.

11. The integrated circuit of claim 10, wherein each of the plurality of pass elements includes only a transistor.

12. A system comprising:
an integrated circuit having latch, the latch including: a memory unit including a first storage node, and a second storage node, a third storage node, and a fourth storage node, wherein the memory unit includes a first pair of transistors having a first gate coupled to the first storage node, a second gate coupled to the second storage node, and a common drain coupled to the third storage node, a second pair of transistors having a first gate coupled to the first storage node, a second gate coupled to the second storage node, and a common drain coupled to the fourth storage node, a third pair of transistors having a first gate coupled to the third storage node, a second gate coupled to the fourth storage node, and a common drain coupled to the first storage node, and a fourth pair of transistors having a first gate coupled to the third storage node, a second gate coupled to the fourth storage node, and a common drain coupled to the second storage node;
a transfer unit including a first pass element coupled between a data input node and the first storage node, a second pass element coupled between the data input node and the second storage node, a third pass element coupled between the data input node and the third storage node, and a fourth pass element coupled between the data input node and the fourth storage node;
an inverter coupled between the data input node and the first and second pass elements; and
an output unit including at least one pair of transistors coupled between the memory unit and a latch output node; and a dynamic random access memory device coupled to the integrated circuit.

13. The system of claim 12, wherein the at least one pair of transistors of the output unit includes a first gate coupled to the third storage node, a second gate coupled to the fourth storage node, and a drain coupled to the latch output node.

14. The system of claim 13, wherein the output unit further includes a second pair of transistors having a first gate coupled to the third storage node, a second gate coupled to the fourth storage node, and a drain coupled to the latch output node.

* * * * *